March 2, 1965 SHIGEZO TANAKA 3,171,763
METHOD FOR MAKING SILICON SEMICONDUCTOR DEVICES
Filed Feb. 21, 1963

INVENTOR.
SHIGEZO TANAKA
BY Haggard & Calimafde
ATTORNEYS 3,171,763
Patented Mar. 2, 1965

3,171,763

METHOD FOR MAKING SILICON SEMICONDUCTOR DEVICES

Shigezo Tanaka, Tokyo, Japan, assignor to Nippon Electric Company Limited, Tokyo, Japan, a corporation of Japan Filed Feb. 21, 1963, Ser. No. 260,263
4 Claims. (Cl. 148—185)

This invention relates in general to silicon semiconductor devices and in particular to silicon-aluminum PN junctions in semiconductor devices.

In the prior art, silicon-aluminum PN junctions have been formed by alloying pure aluminum wire to silicon at a high enough temperature to form a re-crystallized region containing an alloy of silicon and alumium. When the alloyed junction was cooled, however, a crack or fracture would often appear in the silicon near the boundary of the re-crystallized region due to the difference between the coefficients of thermal expansion in the silicon and the re-crystallized region. This crack or fracture degraded the current vs. voltage characteristic of the diode by increasing the back current through the junction.

Several methods have been employed in the past to minimize cracking in silicon-aluminum junctions. One method was to cool the alloyed junction very slowly, thereby minimizing the mechanical strain; another was to remove all pressure from the junction before starting the cooling process; and another was to form an extremely thin re-crystallized region by applying pressure between the silicon and the aluminum over a relatively long period of time at a temperature directly below eutectic. These methods, however, had the obvious disadvantage of being time consuming and inconvenient. In addition, they did not improve the junction itself, they merely minimized the danger of cracking.

Accordingly, one object of this invention is to provide a convenient method of manufacturing fracture-free silicon-aluminum junctions in semiconductor devices.

Another object of this invention is to provide a method of manufacturing silicon-aluminum junctions which have improved characteristics over those heretofore known in the art.

Other objects and advantages of the invention will be apparent to those skilled in the art from the following description of one specific embodiment thereof, as illustrated in the attached drawings, in which.

Figure 1:
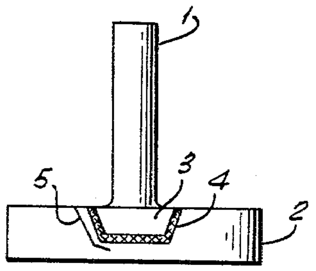
FIGURE 1 is an elevation section of a prior art silicon-aluminum junction containing a fracture.
Figure 3:
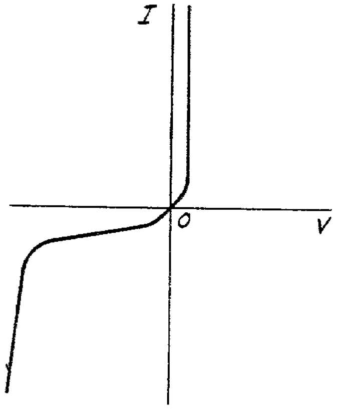
FIGURE 3 is a voltage-current curve for the junction shown in FIGURE 1.

FIGURE 1 shows a prior art silicon-aluminum diode which is formed by alloying an aluminum wire 1 to a silicon base 2. During the alloying process, the aluminum and the silicon are held together and heated to produce a silicon-aluminum alloy which, when cooled, produces a re-crystallized region 3 which has a junction 4 with the silicon base 2. During the cooling process, however, a crack 5 often forms in silicon base 2 adjacent to the re-crystallized region 3 due to the difference in the temperature coefficient of expansion in the two regions. Crack 5 tends to increase the back current through the junction, and produces the type of characteristic curve shown in FIGURE 3, which is undesirable because of its relatively large back current and its relatively slow transition from high back impedance to low back impedance in the zener breakdown region.

Figure 2:
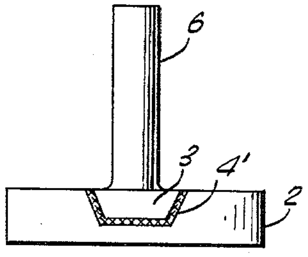
FIGURE 2 is an elevation section of a silicon-aluminum junction manufactured according to the method of this invention.
Figure 4:
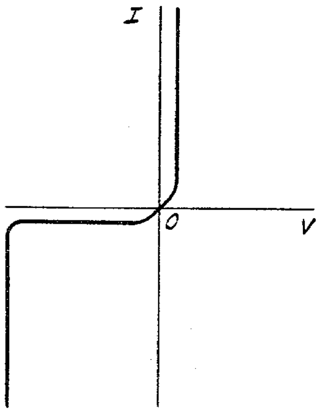
FIGURE 4 is a voltage-current curve for the junction shown in FIGURE 2.

In accordance with this invention, however, it has been found that the above described silicon-aluminum junction can be substantially improved by adding sodium to the silicon-aluminum alloy. The sodium tends to spheroidize the dendritic texture of the alloy and improves its mechanical properties, particularly elasticity. In this invention, an aluminum wire 6 containing 0.1% of sodium is held against a silicon base 2 (FIGURE 2) and heated above the eutectic temperature for several minutes to form an aluminum-sodium-silicon alloy which in turn forms a re-crystallized region 3′ that meets silicon base 2 at a boundary 4′. During the cooling process, the mechanical properties of the re-crystallized region are so improved by the sodium as to eliminate fracturing, even when the junction is quick-quenched. Quick quenching is, in fact, more effective in this invention for improving the mechanical properties of the re-crystallized region. This improvement of the mechanical properties of the re-crystallized region improves the electrical characteristics of the junction, as shown in FIGURE 4, by preventing fractures in the silicon base during cooling. In addition, the improvement also increases the strength of the joint between the aluminum wire 6 and the silicon base, thereby decreasing the probability of breakage during subsequent assembly operations and during use.

The above noted advantages can also be obtained by coating the surface of a pure aluminum wire with a mixed salt containing enough sodium halide so that the mixed salt will melt below the alloying temperature and contribute approximately 0.1% sodium to the melted aluminum. The following salt mixtures can be used to provide sodium at the corresponding melting points:

(A) $Na_2SO_4$-NaCl-NaF (melting point =630° C.)
(B) $Na_2CO_3$-NaCl-NaF (melting point=570° C.)
(C) NaI-NaCl-NaF (melting point=530° C.)
(D) $Na_2CO_3$-KCl-NaF (melting point=530° C.)

The exact composition of these illustrating salt mixtures can be easily determined for any specific application in accordance with well known prior art formulas.

From the foregoing description it will be apparent that this invention provides a method of manufacturing fracture-free silicon-aluminum junctions in semiconductor devices, and also that this invention provides a method of manufacturing silicon-aluminum junctions which have improved characteristics over those heretofore known in the art and it should be understood that this invention is by no means limited to the specific embodiments disclosed herein by way of example, since many modifications can be made in the disclosed structure without departing from the basic teaching of this patent application. For example, this invention is not limited to rectifying junctions such as illustrated herein; it can also be applied to ohmic junctions of silicon and aluminum. This and other modifications of the invention will be apparent to those skilled in the art, and this invention includes all modifications falling within the scope of the following claims.

I claim:

1. In a method of inhibiting cracking in the manufacture of fused alloy junctions of silicon-aluminum by heating aluminum in contact with silicon to form an alloy thereof, the improvement in combination therewith consisting of adding approximately 0.1% by weight of sodium.

2. The method defined in claim 1, wherein before heating, said aluminum includes sodium intimately associated therewith in an amount consisting of approximately 0.1% of said aluminum.

3. The method defined in claim 1 wherein the sodium is derived from a mixture of salts containing sodium halide while maintaining said mixture of salts in contact with the junction during heating.

4. In a method of inhibiting cracking in the manufacture of fused alloy junctions of silicon-aluminum by heating aluminum in contact with silicon to form an alloy thereof, the improvement in combination therewith consisting of adding a small but effective amount of sodium to inhibit said cracking.

References Cited by the Examiner

UNITED STATES PATENTS

| | | | |
|---|---|---|---|
| 2,817,609 | 12/57 | Waters | 148—185 |

DAVID L. RECK, *Primary Examiner.*

HYLAND BIZOT, *Examiner.*